United States Patent
Yang et al.

(10) Patent No.: US 9,534,762 B2
(45) Date of Patent: Jan. 3, 2017

(54) TOUCH KEY CONTROL AND ICON DISPLAY APPARATUS

(71) Applicant: MYSON CENTURY, INC., Hsinchu (TW)

(72) Inventors: Tsen-Shau Yang, Taipei (TW); Yuan-Chih Chung, Hsinchu (TW); Yi-Chuan Peng, Hsinchu (TW)

(73) Assignee: Myson Century, Inc., Hsinchu (TW)

( * ) Notice: Subject to any disclaimer, the term of this patent is extended or adjusted under 35 U.S.C. 154(b) by 371 days.

(21) Appl. No.: 13/920,873

(22) Filed: Jun. 18, 2013

(65) Prior Publication Data

US 2014/0009904 A1   Jan. 9, 2014

(30) Foreign Application Priority Data

Jul. 3, 2012   (TW) .............................. 101212805 U

(51) Int. Cl.
| | |
|---|---|
| *F21V 7/00* | (2006.01) |
| *G06F 3/01* | (2006.01) |
| *G06F 3/02* | (2006.01) |
| *G06F 3/044* | (2006.01) |
| *H03K 17/96* | (2006.01) |

(52) U.S. Cl.
CPC . *F21V 7/00* (2013.01); *G06F 3/01* (2013.01); *G06F 3/0202* (2013.01); *G06F 3/044* (2013.01); *H03K 17/962* (2013.01); *H01H 2219/066* (2013.01); *H03K 17/9622* (2013.01); *H03K 2217/96079* (2013.01)

(58) Field of Classification Search
CPC .............. H03K 17/9622; H03K 17/962; H03K 2217/96079; G06F 3/01; G06F 3/044; F21V 7/00; G06G 3/0202; H01H 2219/066

USPC ........................................... 362/23.03, 23.07
See application file for complete search history.

(56) References Cited

U.S. PATENT DOCUMENTS

| | | | | |
|---|---|---|---|---|
| 4,880,969 | A * | 11/1989 | Lawrie | 250/221 |
| 7,576,631 | B1 * | 8/2009 | Bingle et al. | 340/5.54 |
| 7,671,851 | B1 * | 3/2010 | Pryor | 345/184 |
| 2004/0252867 | A1 * | 12/2004 | Lan | G06K 9/0004 382/124 |
| 2006/0262549 | A1 * | 11/2006 | Schmidt et al. | 362/459 |
| 2007/0103430 | A1 * | 5/2007 | Nishi | 345/156 |
| 2008/0225016 | A1 * | 9/2008 | Lee | 345/174 |
| 2009/0174664 | A1 * | 7/2009 | Han | 345/168 |

* cited by examiner

*Primary Examiner* — Diane Lee
*Assistant Examiner* — Mitchell Errett
(74) *Attorney, Agent, or Firm* — WPAT, P.C., Intellectual Property Attorneys; Anthony King

(57) ABSTRACT

A touch key control and icon display apparatus includes a first substrate, a light-emitting element, a second substrate, and a body portion. The light-emitting element is disposed adjacent to the first substrate. The second substrate includes a circuit layer configured to sense a touch. The body portion is disposed between the first and second substrates and includes a reflective surface that defines a chamber. The chamber is formed through the body portion and configured to receive the light-emitting element. The circuit layer includes an icon disposed adjacent to an opening of the chamber. A portion of light, from the light-emitting element, incident on the circuit layer can pass through the circuit layer, and another portion of the light can be reflected by the circuit layer.

13 Claims, 5 Drawing Sheets

TOUCH KEY CONTROL AND ICON DISPLAY APPARATUS

CROSS-REFERENCE TO RELATED APPLICATION

The present application is based on, and claims priority from, Taiwan Patent Application Serial Number 101212805, filed on Jul. 3, 2012, the disclosure of which is hereby incorporated by reference herein in its entirety.

BACKGROUND OF THE INVENTION

1. Field of the Invention

The present invention relates to a touch system.

2. Description of the Related Art

Touch control technologies allow users to directly touch displayed information to select the information and functions they desire. Touch control technologies simplify the input interfaces of electronic apparatuses and make the input interfaces more convenient for users. Therefore, many electronic apparatuses adopt touch control technologies as their input interfaces.

To date, touch control technologies can be classified into touch screen technologies or touch button technologies. The touch screen technologies are usually used with LCDs (liquid crystal displays) as user interfaces. The touch button technologies usually detect the change of capacitance to accomplish the purpose of input controls.

Touch button devices can be substituted for conventional mechanical switches or push buttons. Since mechanical movements and contact surface abrasions have been eliminated, the touch button device can have a longer operational lifespan. Moreover, due to having a smooth touch surface, the touch button device can be a thin, light, and aesthetically pleasing design.

On either the screen of a touch control system (such as a touch screen device) or a touch button device, information or data is necessarily displayed. The displayed information or data may be numbers, characters, icons or symbols, through which users can obtain desired services. To display the information or data, a touch control system needs a light source that can provide a sufficient amount light required to display the information and data. However, providing uniform light on the screen or the touch buttons is always a challenge for the design of the display portion of a touch control system. The screens of some conventional touch control systems use complex designs and expensive components, such as light-guide plates or light-guided pipes, to provide uniform light. However, the cost of a touch screen is increased when the touch screen has a complex design and is built using expensive components. In addition, icons are additionally needed to be formed on the screens of a portion of conventional touch control systems, and such a design may result in higher costs.

SUMMARY OF THE INVENTION

One embodiment of the present invention discloses a touch key control and icon display apparatus. The touch key control and icon display apparatus comprise a first substrate, a light-emitting element, a second substrate, and a body portion. The light-emitting element may be disposed adjacent to the first substrate. The second substrate may comprise a circuit layer configured to sense a touch. The body portion may be disposed between the first and second substrates and comprise a reflective surface that defines a chamber. The chamber may be formed through the body portion and configured to receive the light-emitting element. The circuit layer may comprise an icon disposed adjacent to an opening of the chamber. A portion of light, from the light-emitting element, incident on the circuit layer may pass through the circuit layer, and another portion of the light may be reflected by the circuit layer.

One embodiment of the present invention discloses a touch key control and icon display apparatus. The touch key control and icon display apparatus may comprise a circuit board, a reflective layer, a light-emitting element, a substrate, and a body portion. The reflective layer may be formed on the circuit board. The light-emitting element may be disposed on the circuit board and through the reflective layer. The substrate may comprise a circuit layer configured to sense a touch. The body portion may be disposed between the circuit board and the substrate, and may comprise a reflective surface that defines a chamber. The chamber may be formed through the body portion and configured to receive the light-emitting element. The circuit layer may comprise an icon disposed adjacent to an opening of the chamber. A portion of light, from the light-emitting element, incident on the circuit layer may pass through the circuit layer, and another portion of the light may be reflected by the circuit layer.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

Figure 1:
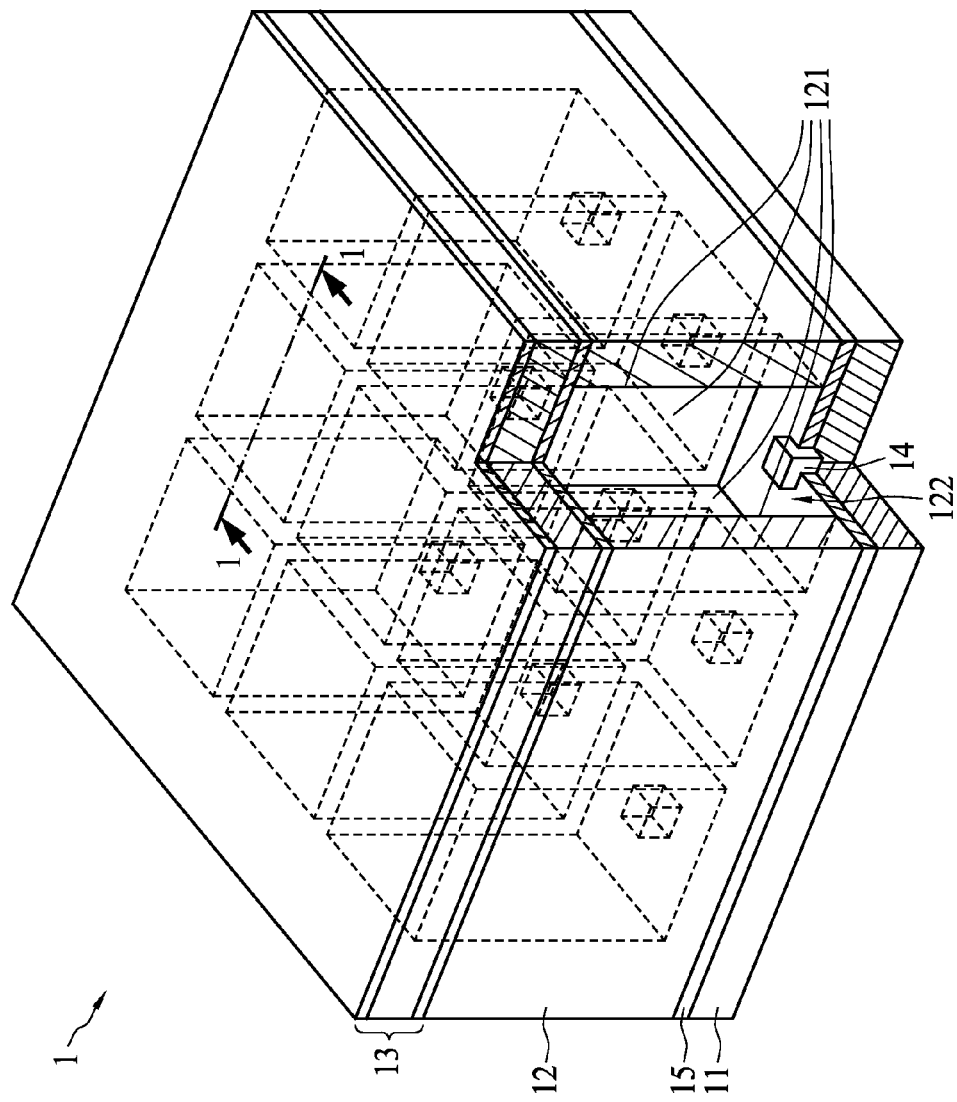
FIG. 1 is a perspective view showing a touch key control and icon display apparatus according to one embodiment of the present invention.
Figure 2:
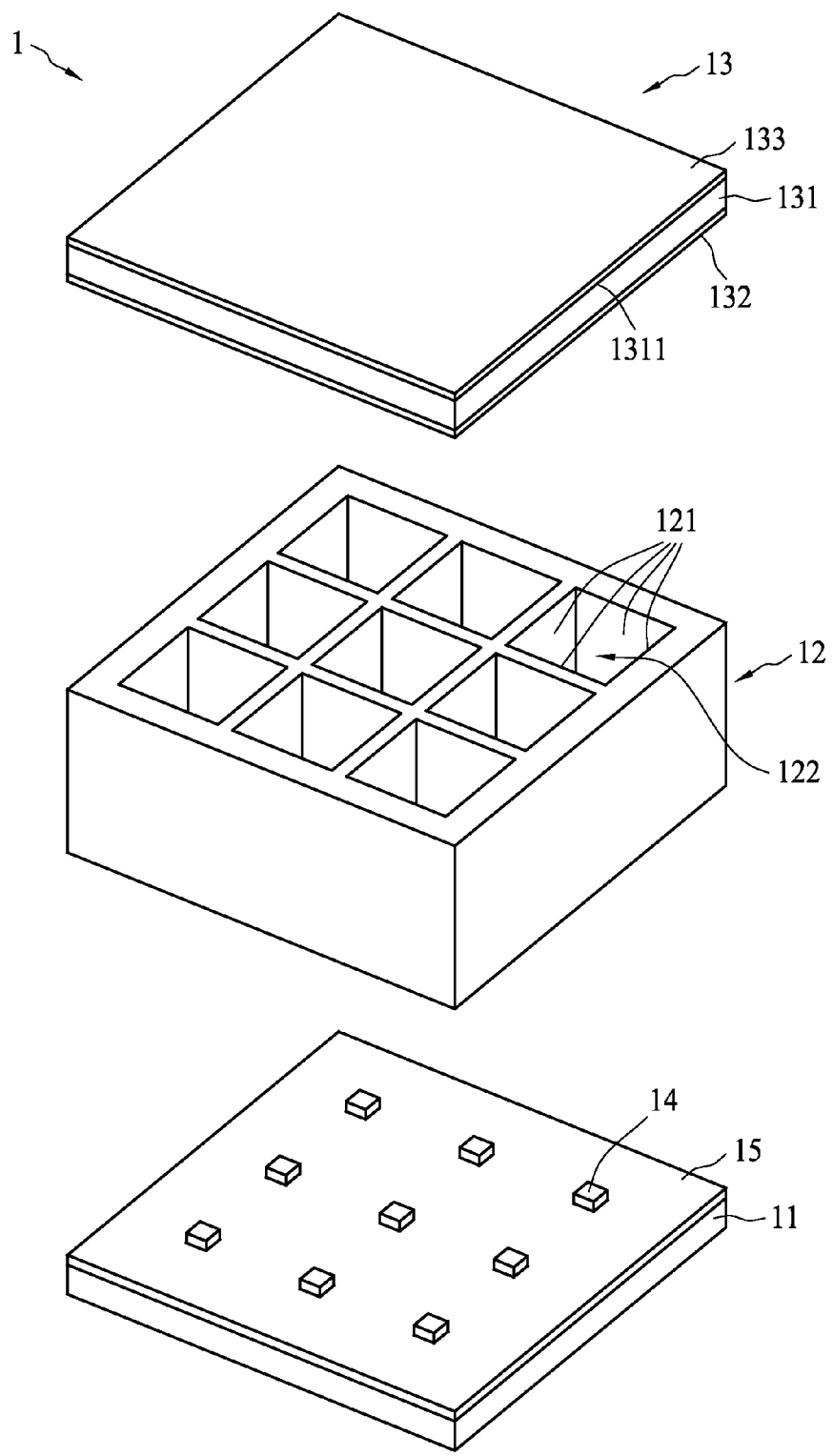
FIG. 2 is an exploded view showing a touch key control and icon display apparatus according to one embodiment of the present invention.

FIG. 1 is a perspective view showing a touch key control and icon display apparatus according to one embodiment of the present invention. FIG. 2 is an exploded view showing a touch key control and icon display apparatus according to one embodiment of the present invention. Referring to FIGS. 1 and 2, the touch key control and icon display apparatus 1 comprises a first substrate 11, at least one light-emitting element 14, a body portion 12, and a second substrate 13. The at least one light-emitting element 14 is disposed adjacent to the first substrate 11. The body portion 12 is disposed between the first substrate 11 and the second substrate 13. The body portion 12 comprises at least one reflective surface 121 that defines at least one chamber 122. The chamber 122 is formed through the body portion 12 and configured to receive a corresponding light-emitting element 14. The second substrate 13 is configured to sense a touch. The second substrate 13 is also configured to allow a portion of light incident on the second substrate 13, from the at least one light-emitting element 14, to pass through the second substrate 13 in order to illuminate display information and reflect another portion of the light. In some embodiments, the apparatus 1 comprises a plurality of light-emitting elements 14. The body portion 12 comprises a plurality of reflective surfaces 121, each of which defines a chamber 122, wherein each light-emitting element 14 is received within a corresponding chamber 122.

The light-emitting element 14 is configured to mainly illuminate the second substrate 13. In some embodiments, the light-emitting element 14 comprises a light bulb. In some embodiments, the light-emitting element 14 comprises a light-emitting diode. The light-emitting element 14 is not limited to the afore-mentioned embodiments. The light-emitting element 14 can comprise other lighting devices.

Figure 3:
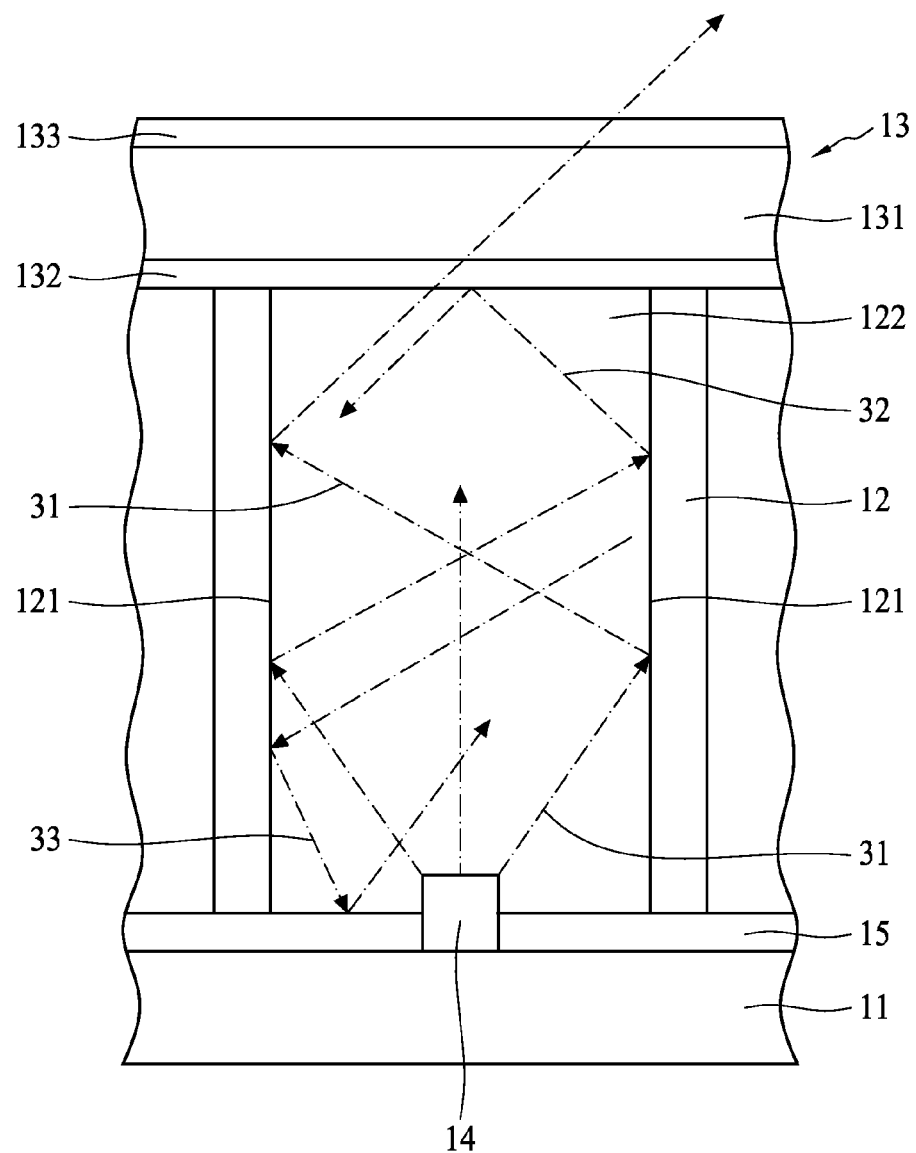
FIG. 3 is a cross-sectional view along line 1-1 of FIG. 1.

Referring to FIG. 3, the chamber 122 of the body portion 12 can propagate light. A light beam 31 travels laterally and in a direction that is away from the chamber 122 and may be reflected back to the chamber 122 by the reflective surface 121 until the light beam 31 travels out of the second substrate 13. The reflective surface 121 can alter part of a light beam's directions from the light-emitting element 14 and change a spatial light intensity distribution. As a result, light can be uniformly projected on the second substrate 13.

In the present embodiment, the chamber 122 can have a rectangular cross-section; however, the present invention is not limited to such an embodiment. In some embodiments, the chamber 122 can have a round cross-section. In some embodiments, the chamber 122 can have a polygonal cross-section. In some embodiments, the chamber 122 can have an elliptical cross-section. The chamber 122 can have a shape other than all the afore-mentioned shapes.

The body portion 12 can be made of a reflective material. In some embodiments, the reflective material can be the material used for the optical coating on a mirror, such as aluminum, gold or silver. In some embodiments, the reflective material can be the material used for the optical coating on a mirror, such as copper, nickel, platinum or rhodium. In some embodiments, the reflective material may be an alloy, such as nickel alloy; however, the present invention is not limited to using nickel alloy. In some embodiments, the reflective material may be a non-metal material, such as polyphthalamide, ceramic, or polycarbonate; however, the present invention is not limited to the afore-mentioned materials. When the body portion 12 is formed with a reflective material, the surface that defines the chamber 122 is a reflective surface.

In another embodiment, the body portion 12 is penetrable by light or impenetrable by light. The body portion 12 may comprise a polymer material, and the reflective surface 121 is a surface of a reflective coating or layer. In some embodiments, the coating is a metal layer, and the metal layer may comprise aluminum, gold, silver, copper, nickel, platinum, or rhodium. In some embodiments, the coating may comprise alloy, such as nickel alloy. In some embodiments, the reflective surface 121 is a metal surface that is impenetrable by light. In some embodiments, the reflective surface 121 is an alloy surface that is impenetrable by light.

In some embodiments, the reflective surface 121 can reflect light, but not absorb light.

In some embodiments, the reflective surface 121 can be configured such that the reflective surface 121 reflects light by regular reflection. In some embodiments, the reflective surface 121 can be configured such that the reflective surface 121 reflects light by scattering reflection.

Referring to FIGS. 2 and 3, the second substrate 13 comprises a plate body 131 and a surface layer 132. The surface layer 132 is disposed on a major surface of the plate body 131. In some embodiments, the plate body 131 is transparent. In some embodiments, the plate body 131 comprises glass. In some embodiments, the plate body 131 comprises a polymer material.

In one embodiment, the plate body 131 comprises a flexible substrate.

As shown in FIG. 3, the surface layer 132 can reflect part of light 32 incident on the second substrate 13 back to the chamber 122 to change the spatial light intensity distribution on the second substrate 13 so that light can be uniformly projected on the second substrate 13. The surface layer 132 can allow part of light incident on the surface layer 132 to pass through. In some embodiments, the surface layer 132 can be a hollow reflective layer.

In some embodiments, the surface layer 132 is disposed between the plate body 131 and the body portion 12. In some embodiments, the surface layer 132 is located opposite to the body portion 12.

The second substrate 13 can be configured to sense a touch. In some embodiments, the surface layer 132 may comprise a circuit layer, in which the metal portion of the circuit layer can reflect part of light from the light-emitting element 14, and the non-metal portion allows another part of light to pass through. In some embodiments, the circuit layer is configured as a sensing circuit that uses a capacitive touch technology.

Figure 4:
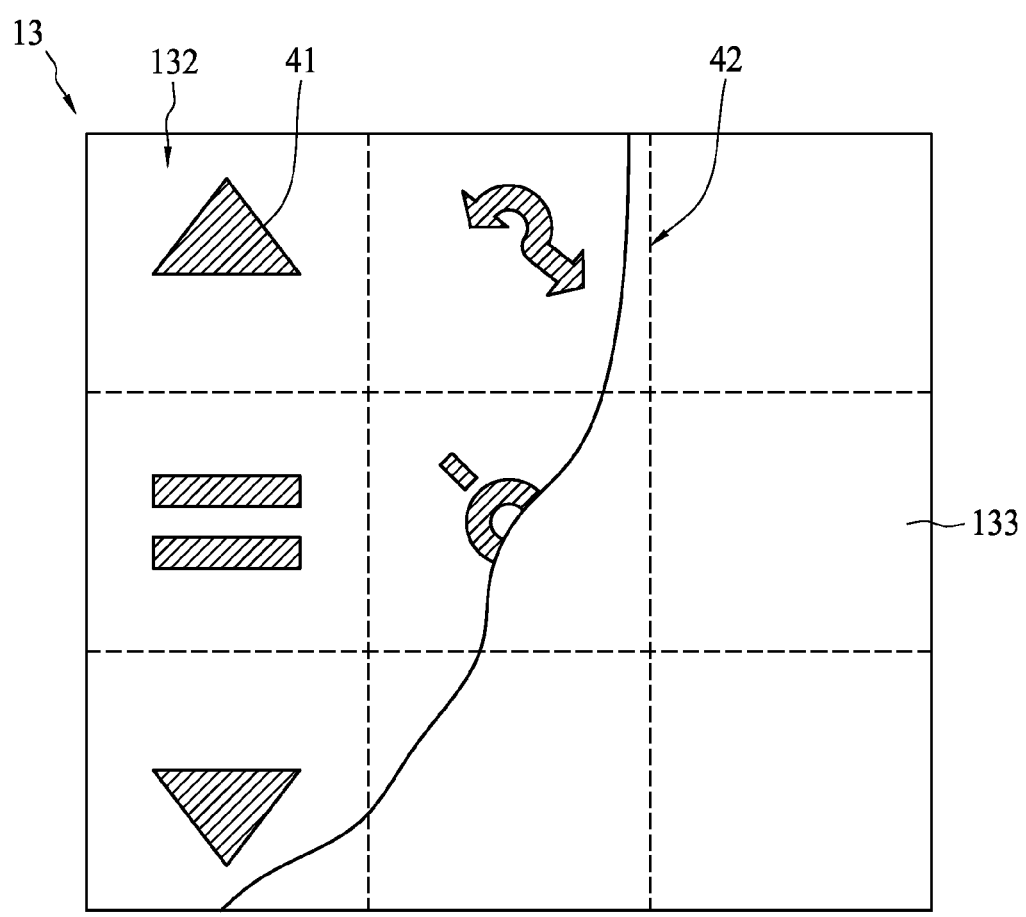
FIG. 4 is a schematic view showing a second substrate according to one embodiment of the present invention.

Light passing through the second substrate 13 can make icons visible. Referring to FIG. 4, the surface layer 132 may comprise at least one icon 41, which is disposed in a position corresponding to an opening of a corresponding chamber 122. Light projected outward from the chamber 122 can make the icon 41 visible. In some embodiments, the surface layer 132 comprises a circuit layer configured to sense a touch, and the circuit layer comprises the icon 41. The icon 41 is configured to represent an operational function. In one embodiment, the icon 41 is formed by a hollow portion of the circuit layer. In another embodiment, the icon 41 can be formed by a solid portion of a material that is impenetrable by light.

In one embodiment, the second substrate 13 may be configured to have a plurality of buttons 42, the circuit layer may comprise a plurality of icons 41, and the body portion 12 may comprise a plurality of chambers 122, wherein the plurality of buttons 42 correspond to the plurality of icons 41, and the plurality of icons 41 correspond to the plurality of chambers 122. When light passes through the second substrate 13, the plurality of icons 41 are visible and provide guidance so that a user can select a desired button 42. A user can follow the guidance provided by the icons 42, touch an icon 42 the user selects, and then a desired function is accordingly executed.

Referring to FIG. 2, in some embodiments, an optical structure can be formed on an outer surface 1311 of the second substrate 13. In some embodiments, the optical structure comprises at least one lens, wherein the at least one lens is disposed correspondingly to the at least one chamber 122. In some embodiments, the at least one lens is a converging lens. The converging lens can converge light rays out of the second substrate 13 into substantially parallel light rays. In some embodiments, the at least one lens is a diverging lens.

Referring to FIGS. 2 and 4, in some embodiments, the second substrate 13 comprises a cover layer 133. The cover layer 133 is configured to make the surface layer 132 unnoticeable, while the cover layer 133 can allow light to pass through. In some embodiments, the cover layer 133 can be formed by darkening the second substrate 13 with smoke.

Referring to FIGS. 2 and 3, the apparatus 1 may further comprise a reflective layer 15. The reflective layer 15 can be disposed on the first substrate 11. The reflective layer 15 is configured to reflect light rays 33 toward the second substrate 13. In some embodiments, the light-emitting element 14 goes through the reflective layer 15. In some embodiments, the reflective layer 15 comprises metal, such as aluminum, gold, silver, copper, nickel, platinum, or rhodium. In some embodiments, the reflective layer 15 comprises alloy, such as nickel alloy; however, the present invention is not limited to nickel alloy. In some embodiments, the reflective layer 15 comprises an aluminum foil. In some embodiments, the reflective layer 15 comprises a non-metal material, such as polyphthalamide, ceramic, or polycarbonate. The reflective layer 15, the surface layer 132, and the reflective surface 121 can form into a reflective chamber, which can change the spatial light intensity distribution on the second substrate 13 and make light uniformly project onto the second substrate 13.

In some embodiments, the first substrate 11 can reflect light such that the apparatus 1 does not need the reflective layer 15.

In some embodiments, the first substrate 11 comprises a circuit board. The light-emitting element 14 is disposed on the first substrate 11 and configured to receive electrical power through the first substrate 11.

Figure 5:
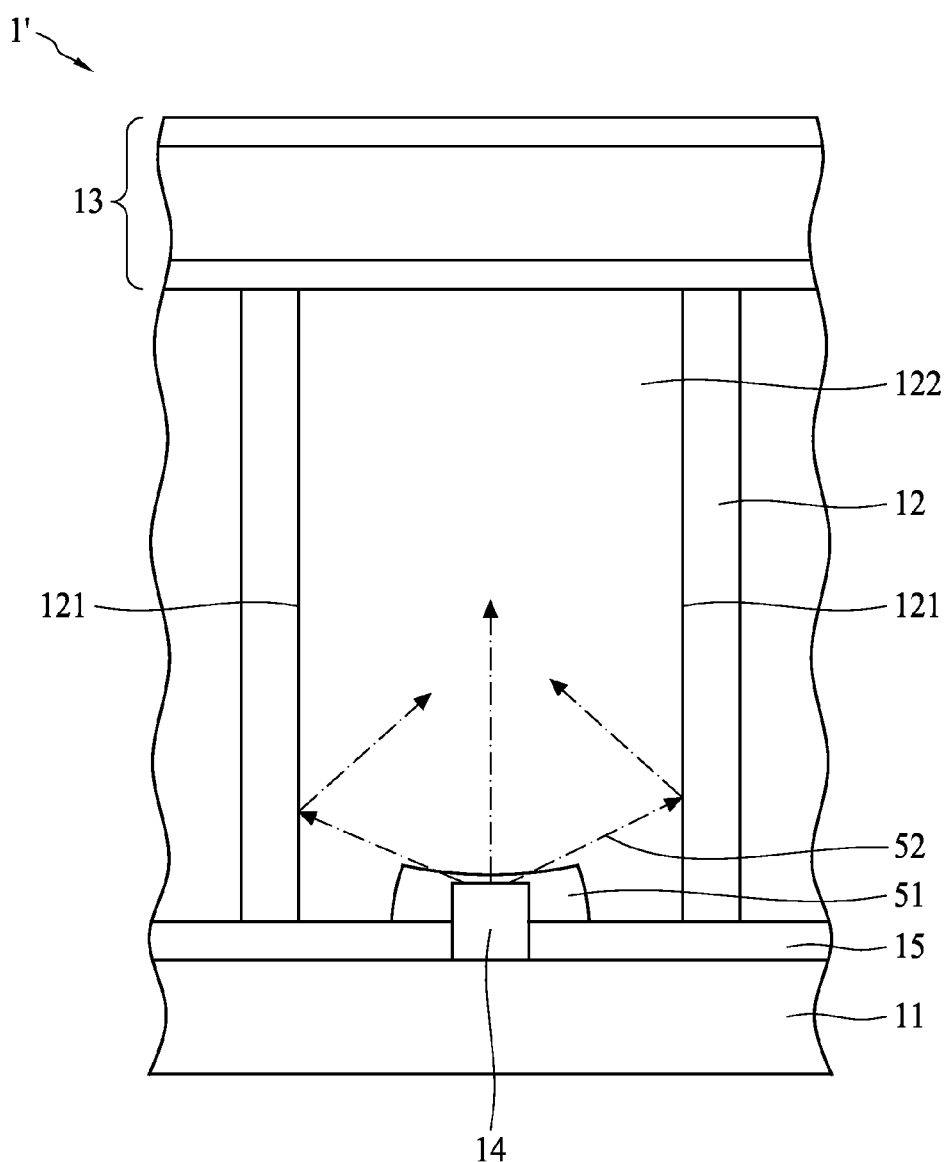
FIG. 5 is a cross-sectional view showing a touch key control and icon display apparatus according to another embodiment of the present invention.

FIG. 5 is a cross-sectional view showing a touch key control and icon display apparatus 1' according to another embodiment of the present invention. The touch key control and icon display apparatus 1' of FIG. 5 is similar to that of FIG. 1. The main difference is that the touch key control and icon display apparatus 1' of FIG. 5 further comprises a diverging lens 51. The diverging lens 51 can be disposed above the light-emitting element 14. The diverging lens 51 can cause the light from the light-emitting element 14 to diverge so that more light 52 from the light-emitting element 14 is directed onto the reflective surface 121, and thus, the spatial light intensity distribution on the second substrate 13 can be accordingly changed and light projected onto the second substrate 13 can be more uniform.

The above-described embodiments of the present invention are intended to be illustrative only. Numerous alternative embodiments may be devised by persons skilled in the art without departing from the scope of the following claims.

What is claimed is:

1. A touch key control and icon display apparatus comprising:
    a first substrate;
    a light-emitting element disposed adjacent to the first substrate;
    a second substrate comprising a circuit layer configured to sense a touch;
    a body portion disposed between the first and second substrates and comprising a reflective surface that defines a chamber, wherein the chamber is formed through the body portion and configured to receive the light-emitting element; and
    a diverging lens, which is disposed over the light-emitting element;
    wherein the circuit layer comprises an icon disposed adjacent to an opening of the chamber;
    wherein a portion of light, from the light-emitting element, incident on the circuit layer passes through the circuit layer, and another portion of the light is reflected by the circuit layer.

2. The touch key control and icon display apparatus of claim 1, wherein the second substrate comprises a cover layer that is configured to make the circuit layer unnoticeable while allowing light to pass through.

3. The touch key control and icon display apparatus of claim 1, wherein the first substrate comprises a reflective material.

4. The touch key control and icon display apparatus of claim 1, further comprising a reflective layer disposed on the first substrate.

5. The touch key control and icon display apparatus of claim 1, wherein the reflective surface comprises a metal or alloy surface.

6. The touch key control and icon display apparatus of claim 1, wherein the reflective surface comprises an aluminum, gold, silver, copper, nickel, platinum, or rhodium surface.

7. The touch key control and icon display apparatus of claim 1, wherein the first substrate is a circuit board, wherein the light-emitting element is attached to the circuit board.

8. The touch key control and icon display apparatus of claim 1, wherein the reflective surface comprises an opaque metal or alloy surface.

9. A touch key control and icon display apparatus comprising:
    a circuit board;
    a reflective layer formed on the circuit board;
    a light-emitting element disposed on the circuit board and going through the reflective layer;
    a substrate comprising a circuit layer configured to sense a touch;
    a body portion disposed between the circuit board and the substrate and comprising a reflective surface that defines a chamber, wherein the chamber is formed through the body portion and configured to receive the light-emitting element; and
    a diverging lens disposed over the light-emitting element;
    wherein the circuit layer comprises an icon disposed adjacent to an opening of the chamber;
    wherein a portion of light, from the light-emitting element, incident on the circuit layer passes through the circuit layer, and another portion of the light is reflected by the circuit layer.

10. The touch key control and icon display apparatus of claim 9, wherein the reflective surface comprises a metal or alloy surface.

11. The touch key control and icon display apparatus of claim 9, wherein the reflective surface comprises an opaque metal or alloy surface.

12. The touch key control and icon display apparatus of claim 9, wherein the reflective surface comprises an aluminum, gold, silver, copper, nickel, platinum, or rhodium surface.

13. The touch key control and icon display apparatus of claim 9, wherein the substrate comprises a cover layer that is configured to make the circuit layer unnoticeable while allowing light to pass through.

* * * * *